(12) United States Patent
Wu

(10) Patent No.: US 7,199,479 B2
(45) Date of Patent: Apr. 3, 2007

(54) CHIP PACKAGE STRUCTURE AND PROCESS FOR FABRICATING THE SAME

(75) Inventor: Jeng-Da Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 9 days.

(21) Appl. No.: 10/907,400

(22) Filed: Mar. 31, 2005

(65) Prior Publication Data
US 2005/0224969 A1  Oct. 13, 2005

(30) Foreign Application Priority Data
Apr. 6, 2004 (TW) ............................... 93109438 A

(51) Int. Cl.
*H01L 23/28* (2006.01)
*H01L 23/29* (2006.01)
(52) U.S. Cl. .................. 257/787; 257/778; 257/737; 257/E23.136; 438/108; 438/127
(58) Field of Classification Search ........... 257/787, 257/E23.136; 438/108, 127
See application file for complete search history.

(56) References Cited

U.S. PATENT DOCUMENTS

| | | | | |
|---|---|---|---|---|
| 6,335,571 B1 * | 1/2002 | Capote et al. | ............... | 257/787 |
| 2003/0170450 A1 * | 9/2003 | Stewart et al. | ............... | 428/343 |
| 2004/0094842 A1 * | 5/2004 | Jimarez et al. | ............... | 257/772 |

* cited by examiner

*Primary Examiner*—Andy Huynh
*Assistant Examiner*—Earl Taylor
(74) *Attorney, Agent, or Firm*—Jianq Chyun IP Office

(57) ABSTRACT

A chip package structure comprises a carrier, a chip and an underfill. The chip has an active surface on which a plurality of bumps are formed. The chip is flip-chip bonded onto the carrier with the active surface facing the carrier, and is electrically connected to the carrier through the bumps. The underfill is filled between the chip and the carrier. A portion of the underfill near the chip serves as a first underfill portion. The portion of the underfill near the carrier serves as a second underfill portion. The Young's modulus of the first underfill portion is smaller than the Young's modulus of the second underfill portion. The second underfill portion can be optionally replaced with a selected encapsulation. The selected encapsulation covers the chip and the carrier around the chip.

10 Claims, 6 Drawing Sheets

CHIP PACKAGE STRUCTURE AND PROCESS FOR FABRICATING THE SAME

CROSS-REFERENCE TO RELATED APPLICATION

This application claims the priority benefit of Taiwan application serial no. 93109438, filed on Apr. 6, 2004. All disclosure of the Taiwan application is incorporated herein by reference.

BACKGROUND OF THE IVENTION

1. Field of the Invention

This invention relates to a chip package structure and a process of fabricating the same. More particularly, this invention relates to a chip package structure formed by flip chip bonding and a process of fabricating the same.

2. Brief Description of Related Art

Electronic devices have been increasingly developed to meet demands of digitalization, network, LAN connection and humanization in use. Therefore, high operation speed, multifunctions, integration, compactness and competitive prices are the key features for commercial success. The Chip package technology must catch up the development trend of the electronic devices with high density and compactness. A flip chip technology uses bumps as the connection intermedium to a carrier, which shortens wire length compared to a conventional wire bonding. Short wire length facilitates increase in signal transmission between the chip and the carrier. Therefore, the flip chip technology has become the main stream in the high-pin-count packaging field.

FIG. 1 is a cross-sectional view of a conventional chip package structure formed by a flip chip technology. Referring to FIG. 1, a chip 50 of a chip package structure 40 has an active surface 52 on which a plurality of bumps 60 are respectively mounted. A plurality of bonding pads 54 are formed on the active surface 52. A plurality of contacts 84 are formed on a carrier 80. The chip 50 electrically connects to the carrier 80 via the bonding pads 54, the bumps 60 and the contacts 84.

Furthermore, in order to protect the chip 50 from being damaged due to the moisture and protect the bumps 60 connecting the chip 50 and the carrier 80 from being damaged due to the mechanical stress, an underfill 70 is filled between the chip 50 and the carrier 80. However, since there is a mismatch in coefficient of thermal expansion (CTE) between the chip 50, the bumps 60, the underfill 70 and the carrier 80, the chip package structure 40 tends to fail due to the thermal stress resulting from temperature difference during thermal cycles.

Upper layers of the chip are called as interconnection that consists of a plurality of conductive layers and dielectric layers sandwiched by the conductive layers. When the Young's modulus of the underfill is high, delamination between the conductive layers and the dielectric layers occurs due to the thermal stress, which deteriorates the interconnections and leads to chip failure. Complying with the appearance of the copper process applied in the semiconductor manufacturing technology, the material constituent of the conductive layers and the dielectric layers are from the set of aluminum and silicon dioxide to the set of copper and organic materials. The adhesion between copper and low-k dielectrics is lower than that between aluminum and silicon dioxide. Therefore, delamination between the copper layer and the low-k dielectrics occurs more often.

Furthermore, when the Young's modulus of the underfill is low, the thermal stress tends to cause cracking of bumps near the carrier, and thereby significantly decreasing the reliability of electric connection between the chip and the carrier. Therefore, how to avoid the damage of interconnection of the chip and the bump due to the CTEs mismatch between the chip, the bumps, the underfill and the carrier is an important issue in this field.

SUMMARY OF THE INVENTION

Therefore, the invention is directed to a chip package structure and a process of fabricating the same capable of reducing the problems caused by coefficient of thermal expansion mismatch between the chip, the bumps, the underfill and the carrier to reduce damage to the interconnection of the chip and the bumps.

According to a first embodiment of the invention, a chip package structure of the invention includes a carrier, a chip and an underfill. The carrier has a first surface and a second surface opposite to the first surface. The chip has an active surface on which a plurality of bumps are formed. The chip is bonded to the first surface of the carrier with the active surface of the chip facing thereto, and electrically connects to the carrier via the bumps. The underfill fills between the chip and the carrier. The portion of the underfill near the chip serves as a first underfill portion. The portion of the underfill near the carrier serves as a second underfill portion. The Young's modulus of the first underfill portion is smaller than the Young's modulus of the second underfill portion.

In the present embodiment of the present invention, the Young's modulus of the first underfill portion is smaller than 7E9 Pa, for example, and the glass transition temperature (Tg) thereof is smaller than 100° C., for example. The Young's modulus of the second underfill portion is in a range of 7E9 to 20E9 Pa, for example, and the glass transition temperature (Tg) thereof is larger than 140° C., for example.

Furthermore, chip package structure of this embodiment may further include an encapsulation covering the chip and the carrier around the chip. The carrier can be a package substrate, for example.

According to a second embodiment of the invention, a chip package structure of the invention includes a carrier, a chip, an underfill and an encapsulation. The chip has an active surface on which a plurality of bumps are formed. The carrier has a first surface and a second surface opposite to the first surface. The chip is bonded to the first surface of the carrier with the active surface of the chip facing thereto, and electrically connects to the carrier via the bumps. The underfill fills the part near the chip that between the chip and the carrier. The encapsulation fills between the underfill and the carrier and covers the chip and the carrier around the chip.

In the second embodiment of the present invention, the Young's modulus of the underfill is smaller than 7E9 Pa, for example, and the glass transition temperature (Tg) thereof is smaller than 100° C., for example. The carrier can be a package substrate, for example.

According to a third embodiment of the present invention, a chip packaging process is provided. First, a carrier and a chip are provided. The carrier has a first surface and a second surface opposite to the first surface. The chip has an active surface on which a plurality of bumps are formed. Than, a first underfill is formed on the active surface of the chip. The first underfill is located between the bumps but does not cover the bumps. The height of the bumps is larger than the thickness of the first underfill. After, the chip is flip-chip bonded onto the first surface of the carrier and electrically connected to the carrier via the bumps. Finally, a second underfill is filled between the first underfill and the carrier. The Young's modulus of the first underfill is smaller than that of the second underfill.

In the third embodiment of the present invention, after the second underfill has been formed, an encapsulation may further applied over the chip and the carrier around the chip.

According to a fourth embodiment of the present invention, a chip packaging process is provided. First, a carrier and a chip are provided. The chip has an active surface on which a plurality of first bumps are formed. The carrier has a first surface and a second surface opposite to the first surface. Than, a first underfill is formed on the active surface of the chip and the first bumps are exposed. After, a plurality of second bumps are correspondingly formed on the first bumps. Thereafter, the chip is flip-chip bonded onto the first surface of the carrier and is electrically connected to the carrier via the first and second bumps. Finally, a second underfill is filled between the first underfill and the carrier. The Young's modulus of the first underfill is smaller than the Young's modulus of the second underfill.

In this embodiment of the present invention, the step of exposing the first bumps includes, for example, grinding the first underfill until the first bumps are exposed. Furthermore, after the second underfill has been formed, an encapsulation may further applied over the chip and the carrier around the chip.

According to a fifth embodiment of the present invention, a chip packaging process is provided. First, a carrier and a chip are provided. The carrier has a first surface and a second surface opposite to the first surface. The chip has an active surface on which a plurality of bumps are formed. Then, an underfill is formed on the active surface of the chip and is located between the bumps without covering the bumps. The height of the bumps is larger than the thickness of the underfill. After, the chip is flip-chip bonded onto the first surface of the carrier and is electrically connected to the carrier via the bumps. Finally, an encapsulation is applied over the chip and the carrier around the chip. The encapsulation fills up between the underfill and the carrier.

According to a sixth embodiment of the present invention, a chip packaging process is provided. First, a carrier and a chip are provided. The carrier has a first surface and a second surface opposite to the first surface. The chip has an active surface on which a plurality of first bumps are formed. Than, an underfill is formed on the active surface of the chip and the first bumps are exposed. After, a plurality of second bumps are correspondingly formed on the first bumps. Next, the chip is flip-chip bonded on the first surface of the carrier and is electrically connected to the carrier via the first and second bumps. Finally, an encapsulation is applied over the chip and the carrier around the chip. The encapsulation fills up between the underfill and the carrier.

In this embodiment of the present invention, the step of exposing the first bumps includes, for example, grinding the first underfill until the first bumps are exposed.

Since the Young's modulus of the first underfill near the chip is smaller than that of the second underfill near the carrier, or the second underfill is replaced with the encapsulation having Young's modulus larger than that of the first underfill, the chip package structure is capable of not only reducing damage to the chip but also avoiding crack of the bumps due to the CTEs mismatch between the chip, the bumps, the carrier and the underfill.

DETAILED DESCRIPTION OF EMBODIMENTS

First Embodiment

Figure 1:
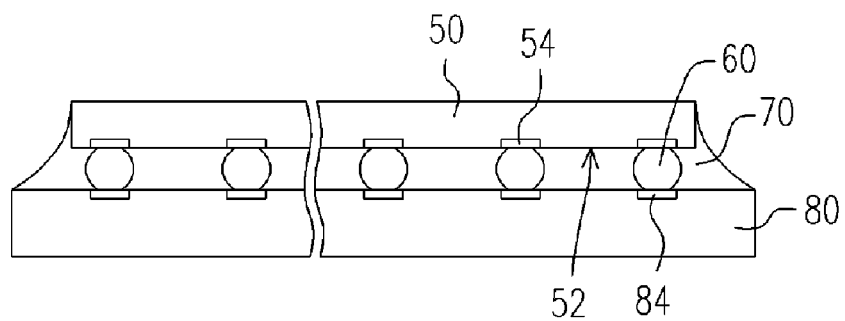
FIG. 1 is a cross-sectional view of a conventional chip package structure formed by flip chip technology.
Figure 2A:
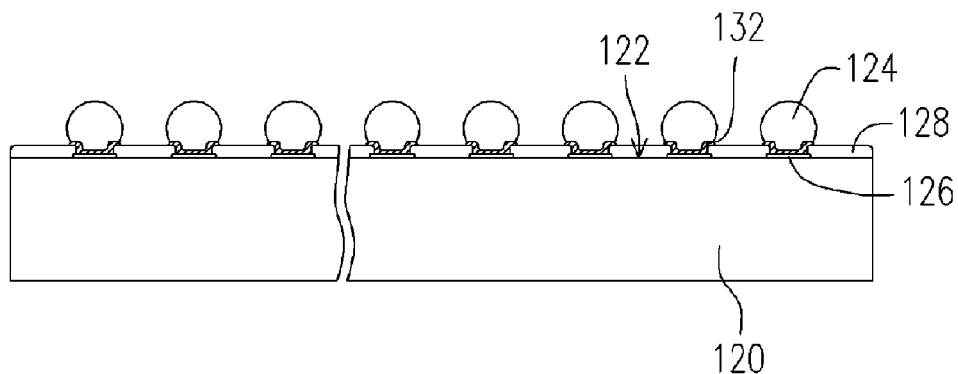
FIGS. 2A–2E are cross-sectional views showing a process of fabricating a chip package structure according to a first embodiment of the invention.
Figure 2B:
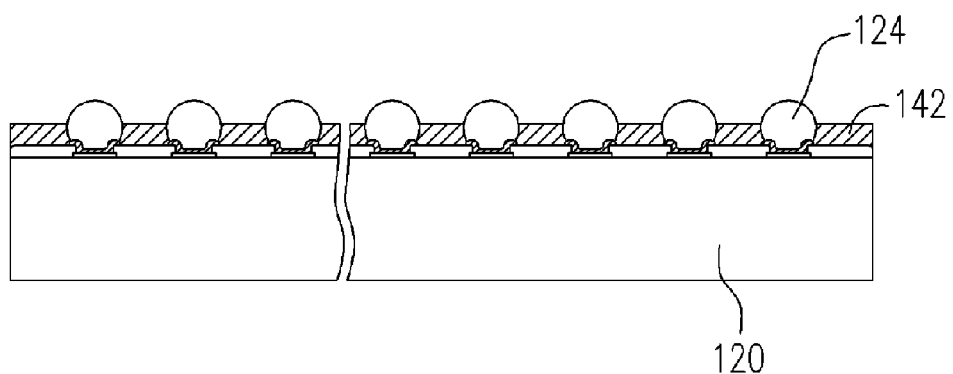
Figure 2C:
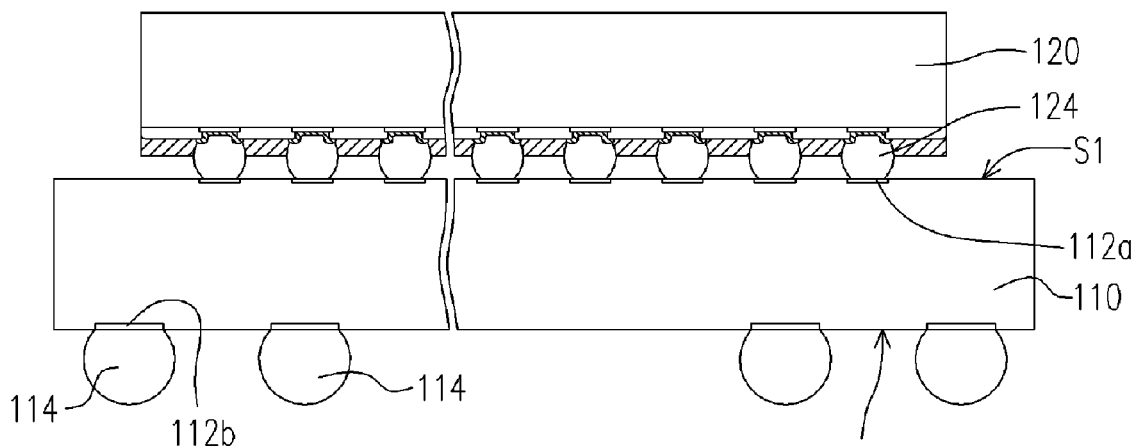

FIGS. 2A–2E are cross-sectional views showing a process of fabricating a chip package structure according to a first embodiment of the invention. Referring to FIGS. 2A–2E, A carrier 110 and a chip 120 are provided first. The carrier 110 is illustrated in FIG. 2C. The carrier can be, for example, an organic package substrate. The carrier 110 has a first surface S1 and a second surface S2 opposite to the first surface S1. The first surface S1 and the second surface S2 respectively have a plurality of contacts 112a and 112b formed thereon. Furthermore, a plurality of solder balls 114 are mounted on contacts 112b in array to facilitate the electric connection to a printed circuit board (PCB) (not shown) in a subsequent Ball Grid Array (BGA) packaging.

The chip 120 has an active surface 122 on which a plurality of bumps 124 are formed thereon. The active surface 122 further has a plurality of bonding pads 126 and a passivation layer 128 thereon. The passivation layer 128 exposes the bonding pads 126 and is used to protect the chip 120. An under bump metallurgy (UBM) 132 forming from a patterned metallic layer may further dispose on each bonding pad 126. The bumps 124 are mounted on the UBMs 132.

Referring to FIG. 2B, a first underfill 142 is formed on the active surface 122 of the chip 120 between the bumps 124, without covering the bumps 124. The height of the bumps 124 is larger than the thickness of the first underfill 142. That is, the bumps 124 protrude over the first underfill 142.

Referring to FIG. 2C, the chip 120 is flip-chip bonded onto the first surface S1 of the carrier 110 and is electrically connected to the carrier 110 via the bumps 124.

Figure 2D:
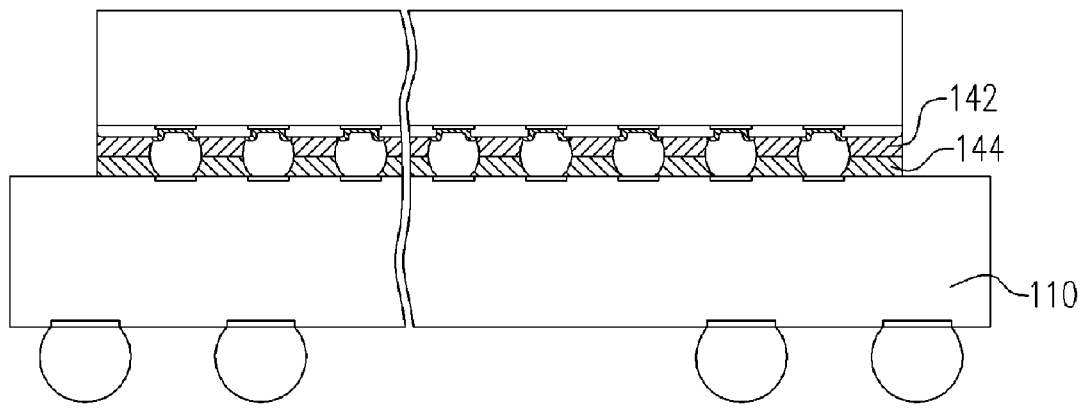

Referring to FIG. 2D, a second underfill 144 is filled between the first underfill 142 and the carrier 110. The Young's modulus of the first underfill 142 is smaller than that of the second underfill 144.

Figure 2E:
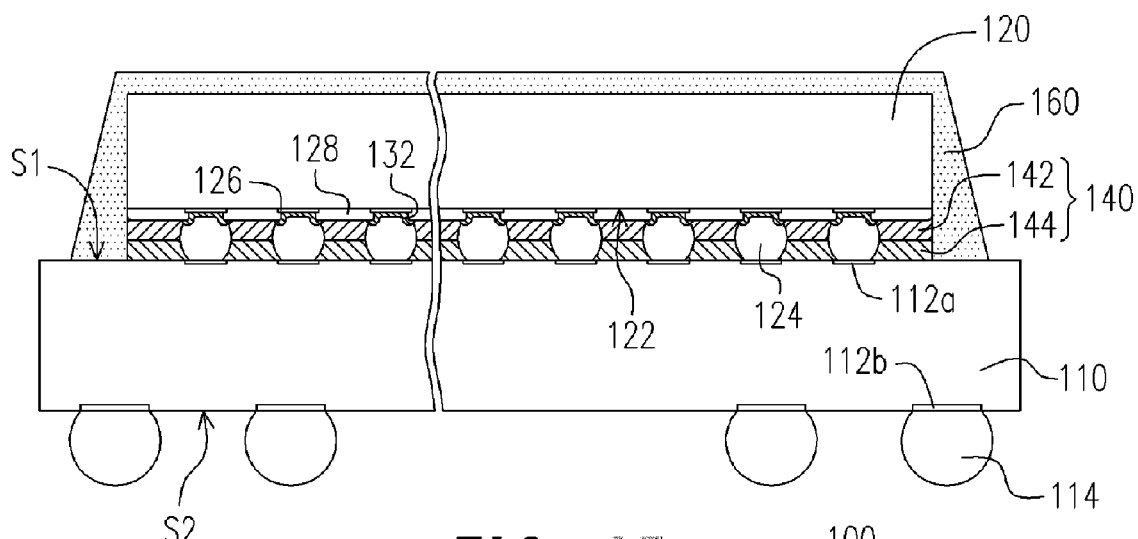

Referring to FIG. 2E, an encapsulation 160 is further applied over the chip 120 and the carrier 110 around the chip 120 after the second underfill 144 has been formed to protect the chip 120 from being damaged during marking and moving.

Referring to FIG. 2E, a chip package structure 100 according to a first embodiment of the invention includes the carrier 110, the chip 120 and an underfill 140. The chip 120 has an active surface 122 on which a plurality of bumps 124 are formed thereon. The chip 120 is flip-chip bonded to a first surface S1 of the carrier 110 with the active surface 122 of the chip 120 facing thereto and is electrically connected to the carrier 110 via the bumps 124. The underfill 140 is filled between the chip 120 and the carrier 110. The portion of the underfill 140 near the chip 120 serves as a first underfill portion 142. The portion of the underfill 140 near the carrier 110 serves as a second underfill portion 144. The Young's modulus of the first underfill portion 142 is smaller than the Young's modulus of the second underfill portion 144.

In this embodiment, the Young's modulus of the first underfill portion 142 is smaller than 7E9 Pa, for example, and the glass transition temperature (Tg) thereof is smaller than 100° C., for example. The Young's modulus of the second underfill portion 144 is in a range of about 7E9 to 20E9 Pa, for example, and the glass transition temperature (Tg) thereof is larger than 140° C., for example. Furthermore, chip package structure 100 may further include an encapsulation 160 covering the chip 120 and the carrier 110 around the chip 120.

Second Embodiment

FIGS. 3A–3G are cross-sectional views showing a process of fabricating a chip package structure according to a second embodiment of the invention. Referring to FIGS. 3A–3G, a carrier 210 and a chip 220 are provided first. The carrier 210 and the chip 220 are similar to the carrier 110 and the chip 120 in the first embodiment and thus the description thereof is omitted herein.

Figure 3A:
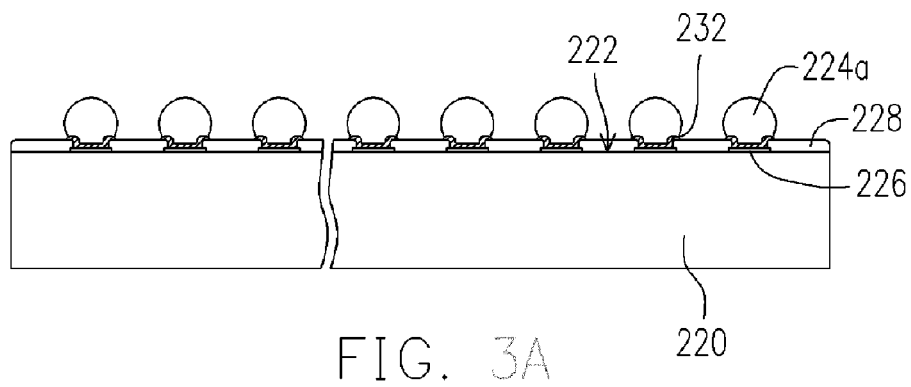
FIGS. 3A–3G are cross-sectional views showing a process of fabricating the chip package structure according to a second embodiment of the invention.
Figure 3B:
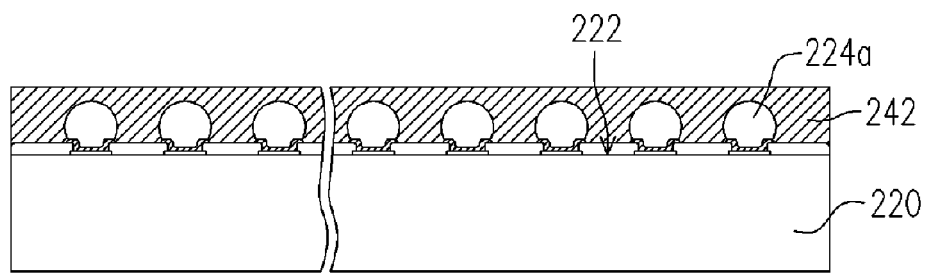

Referring to FIG. 3B, a first underfill 242 is formed on an active surface 222 of the chip 220. The first underfill 242 covers the first bumps 224a that are formed on the active surface 222 of the chip 220. The method of forming the first underfill 242 includes dispensing the first underfill material over the active surface 222 of the chip 220 and curing the first underfill material to form the first underfill 242.

Figure 3C:
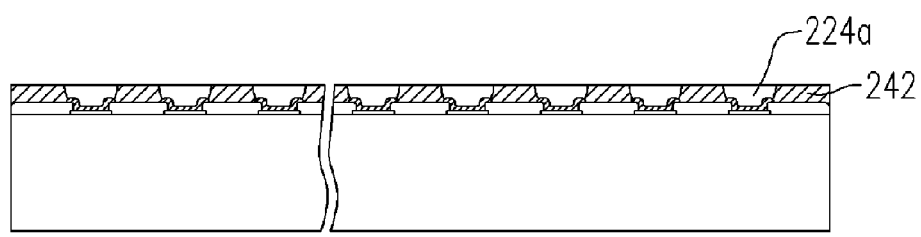

Referring to FIG. 3C, a part of the first underfill 242 is removed by grinding or other methods to expose the first bumps 224a.

Figure 3D:
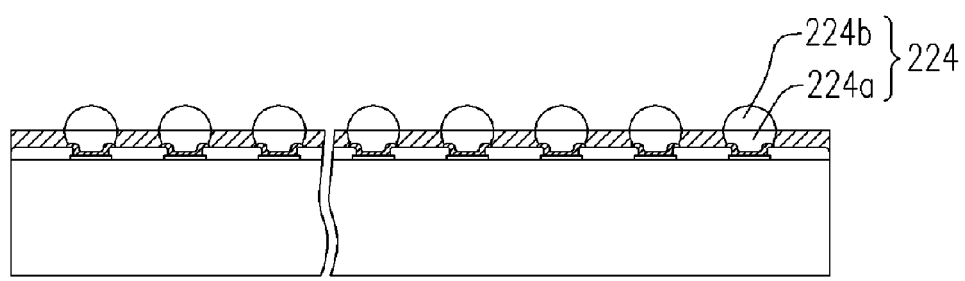

Referring to FIG. 3D, a second bump 224b is formed on each of the first bumps 224a.

Figure 3E:
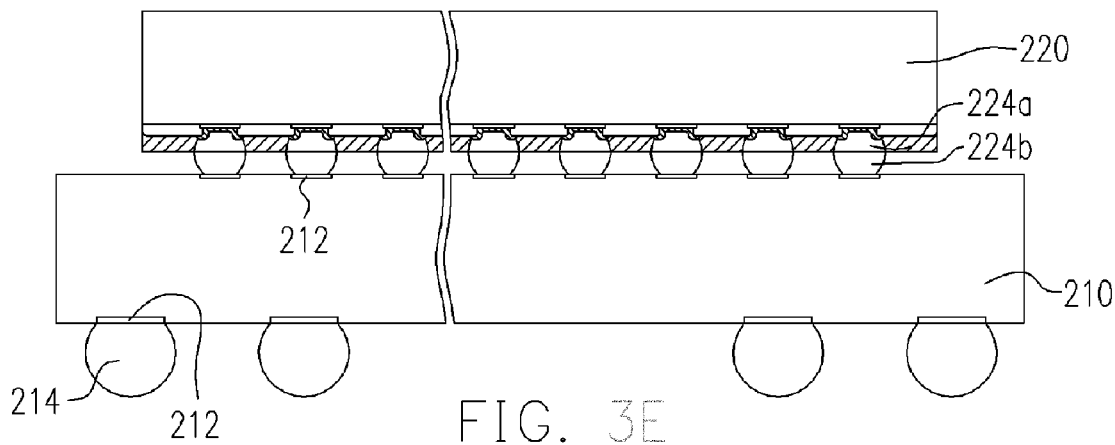

Referring to FIG. 3E, the chip 220 is flip-chip bonded on the carrier 210 and is electrically connected to the carrier 210 via the first and second bumps 224a, 224b.

Figure 3F:
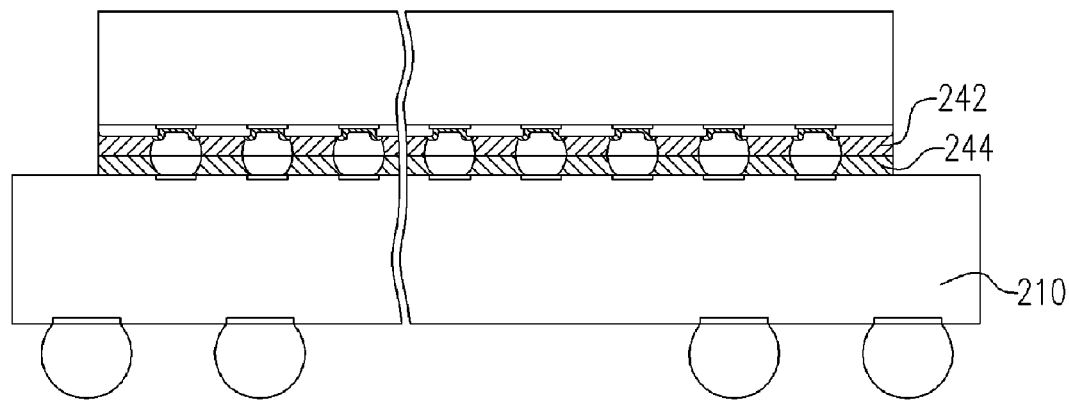

Referring to FIG. 3F, a second underfill 244 is filled between the first underfill 242 and the carrier 210. The Young's modulus of the first underfill 242 is smaller than that of the second underfill 244. The preferred Young's modulus and glass transition temperature of the first and second underfill 242, 244 are identical to those in the first embodiment.

Figure 3G:
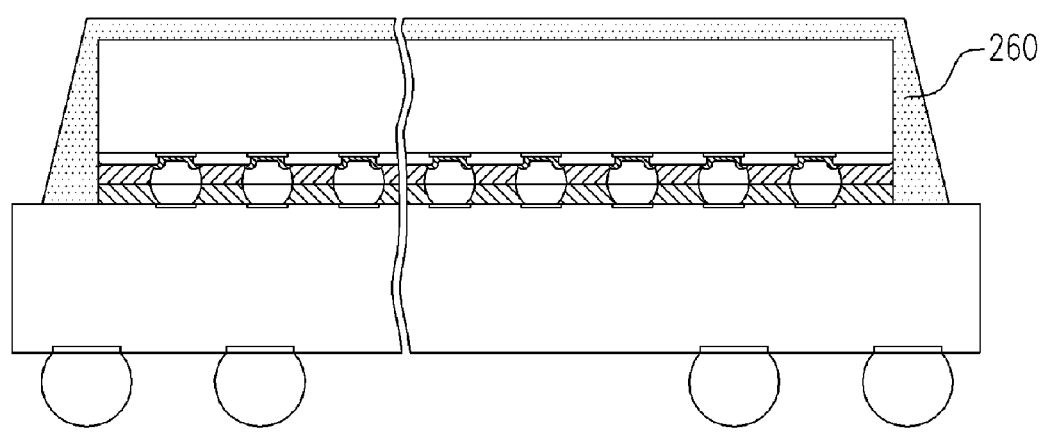
Figure 4A:
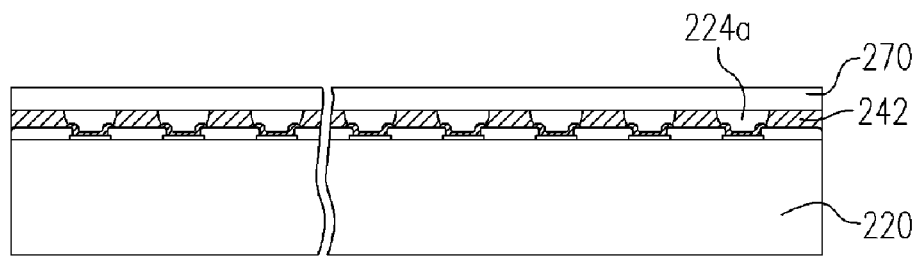
FIGS. 4A–4D are cross-sectional views showing a process of fabricating the second bumps in the chip package structure according to a second embodiment of the invention.
Figure 4B:
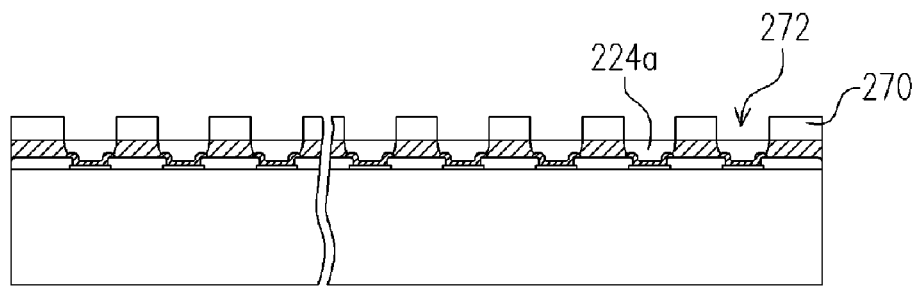
Figure 4C:
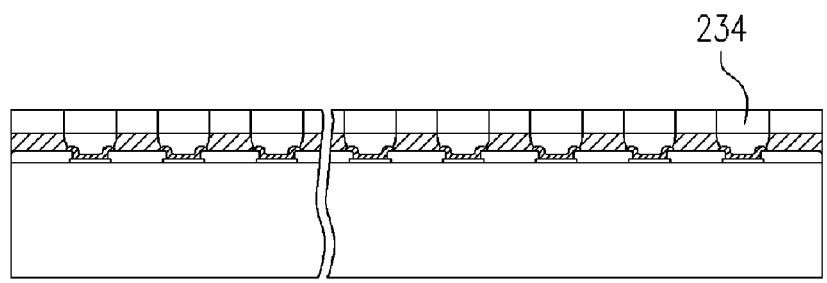
Figure 4D:
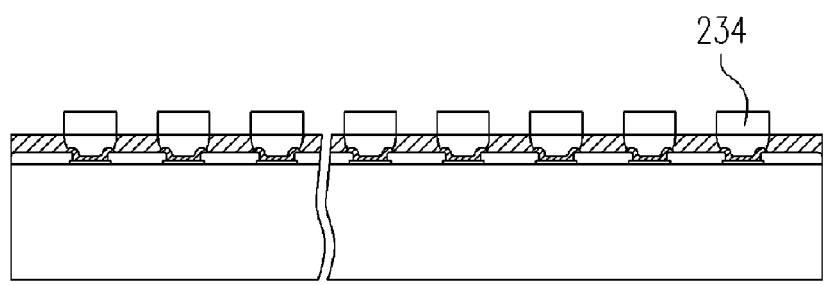

Referring to FIG. 3G, an encapsulation 260 may further applied over the chip 220 and the carrier 210 around the chip 220 after the second underfill 244 has been formed. A chip package structure 200 of this embodiment has the same features as the chip package structure 100 in the first embodiment.

FIGS. 4A–4D are cross-sectional views showing a process of fabricating the second bumps in the chip package structure according to a second embodiment of the invention. The step of forming the second bumps is not limited to the process illustrated below. A photoresist 270 is formed on the chip 220 to cover the first underfill 242 and the first bumps 224a first. Then, a plurality of openings 272 are formed in the photoresist 270 to expose the first bumps 224a. Next, a solder material is filled in the openings 272 to form a plurality of solder bumps 234. Thereafter, the photoresist 270 is removed. Final, the solder bumps 234 are reflowed to form a plurality of bumps 224b on the first bumps 224a, as shown in FIG. 3D. The photoresist 270 can be, for example, a dry film or liquid photoresist. The step of filling the solder material includes, for example, stencil printing.

Third Embodiment

Figure 5:
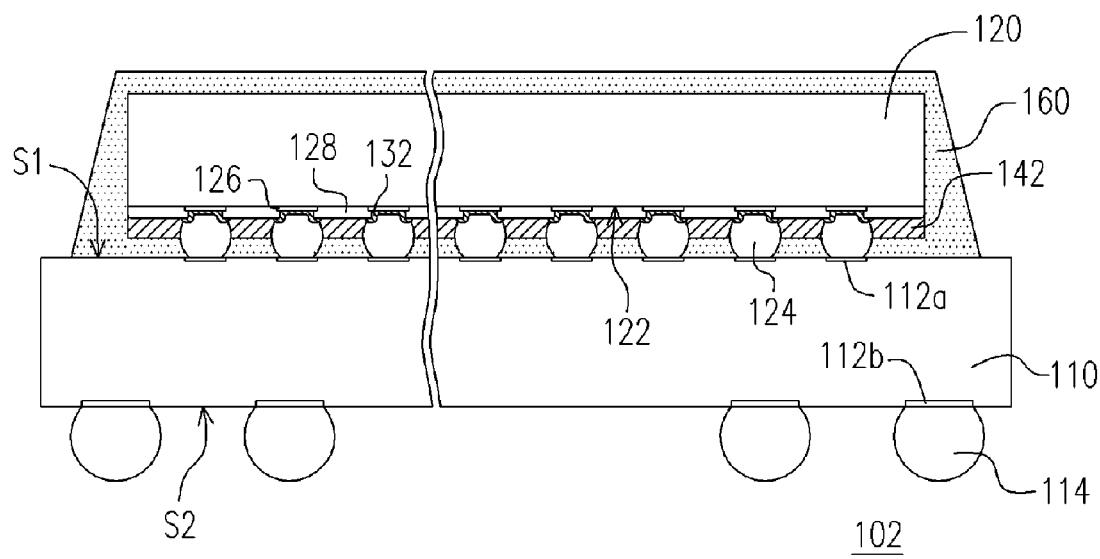
FIG. 5 is a cross-sectional view of a chip package structure according to a third embodiment of the invention.

FIG. 5 is a cross-sectional view of a chip package structure according to a third embodiment of the invention. The process of forming the package structure before applying the encapsulation is similar to the process described with reference to FIGS. 2A–2C. Thereafter, an encapsulation 162 is applied over the chip 120 and the carrier 110 around the chip 120. The encapsulation 162 fills up between the underfill 142 and the carrier 110.

A chip package structure 102 of this embodiment includes the carrier 110, the chip 120, the first underfill 142 and the encapsulation 160. The chip 120 has an active surface 122 on which the bumps 124 are formed thereon. The chip 120 is flip-chip bonded on the first surface S1 of the carrier 110, with the active surface 122 facing the carrier thereto, and is electrically connected to the carrier via the bumps 124. The first underfill 142 is filled between the chip 120 and the carrier 110 near the chip 120. The encapsulation 160 is filled between the first underfill 142 and the carrier 110 to cover the chip 120 and the carrier 110 around chip 120.

In this embodiment, the Young's modulus of the first underfill 142 is smaller than, for example, 7E9 Pa. The glass transition temperature of the first underfill 142 is smaller than 100° C.

Fourth Embodiment

Figure 6:
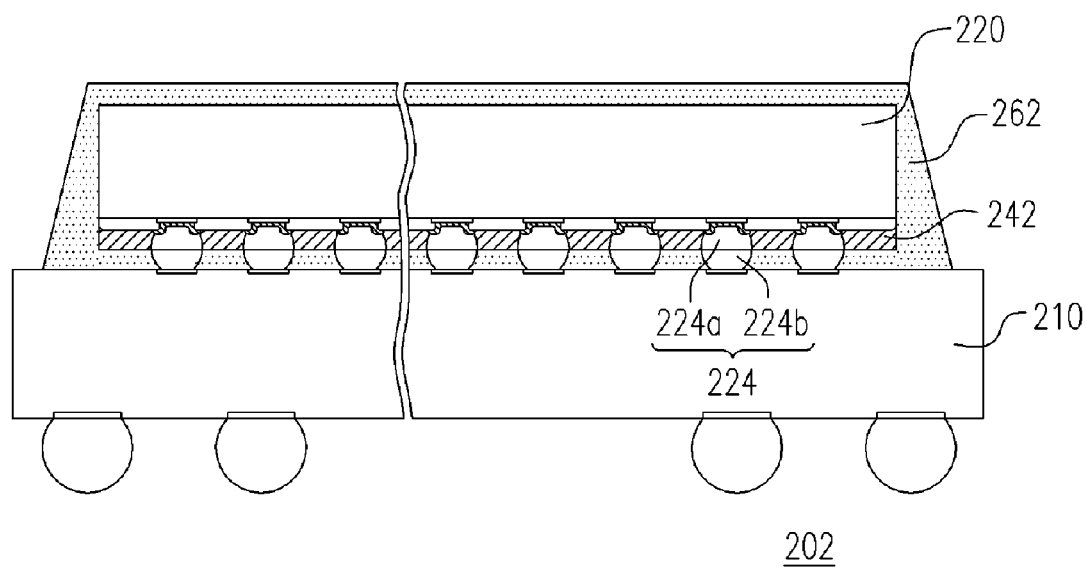
FIG. 6 is a cross-sectional view of a chip package structure according to a fourth embodiment of the invention.

FIG. 6 is a cross-sectional view of a chip package structure according to a fourth embodiment of the invention. The process of forming the package structure before applying the molding material is similar to the process described with reference to FIGS. 3A–3E. Thereafter, an encapsulation 262 is applied over the chip 220 and the carrier 210 around the chip 220. The encapsulation 262 fills up between the underfill 242 and the carrier 210. The chip package structure 202 of this embodiment has the same features as the chip package structure 102 of the third embodiment.

As described above, in the chip package structure of the invention, the Young's modulus of the first underfill near the chip is smaller than that of the second underfill near the carrier. Alternatively, the second underfill can be replaced with an encapsulation having a Young's modulus larger than the Young's modulus of the first underfill. Therefore, the chip package structure of the invention is not only capable of reducing damage to the chip due to the high Young's modulus underfill, but also cracking of the bump due to the low Young's modulus underfill is effectively reduced. Furthermore, a part of the underfill is formed on the chip during the bump formation process. Therefore, the need of filling the encapsulation between the chip and the carrier by capillarity method is greatly reduced, thereby increasing the efficiency of the chip packaging process.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. A chip package structure, comprising:
   a carrier, having a first surface and a second surface opposite to the first surface;
   a chip, having an active surface on which a plurality of bumps are formed, wherein the chip is bonded to the first surface of the carrier with the active surface of the chip facing thereto and electrically connecting to the carrier via the bumps; and
   an underfill, filling between the chip and the carrier, wherein the portion of the underfill near the chip serves as a first underfill portion, the portion of the underfill near the carrier serves as a second underfill portion, and the Young's modulus of the first underfill portion is smaller than the Young's modulus of the second underfill portion, and a glass transition temperature (Tg) of the first underfill portion is smaller than 100° C. and a glass transition temperature (Tg) of the second underfill portion is larger than 140° C.

2. The chip package structure of claim 1, wherein the Young's modulus of the first underfill portion is smaller than 7E9 Pa.

3. The chip package structure of claim 1, wherein the Young's modulus of the second underfill portion is in a range of 7E9 to 20E9 Pa.

4. The chip package structure of claim 1, further comprising a encapsulation covering the chip and the carrier around the chip.

5. The chip package structure of claim 1, wherein the carrier is a package substrate.

6. A chip packaging process, comprising:
   providing a carrier and a chip, wherein the carrier has a first surface and a second surface opposite to the first surface, and the chip has an active surface on which a plurality of bumps are formed;
   forming a first underfill on the active surface of the chip, wherein the first underfill is located between the bumps without covering the bumps, and the height of the bumps is larger than the thickness of the first underfill;
   flip-chip bonding the chip having the first underfill already formed on the active surface of the chip between the bumps onto the first surface of the carrier and electrically connecting the chip to the carrier via the bumps; and
   filling a second underfill between the first underfill and the carrier, wherein the Young's modulus of the first underfill is smaller than that of the second underfill.

7. The process of claim 6, further comprising applying an encapsulation over the chip and the carrier around the chip after the second underfill has been formed.

8. A chip packaging process, comprising:
   providing a carrier and a chip, wherein the carrier has a first surface and a second surface opposite to the first surface, and the chip has an active surface on which a plurality of first bumps is formed;
   forming a first underfill on the active surface of the chip and exposing the first bumps;
   forming a second bump on each the first bump;
   flip-chip bonding the chip having the first bumps and the second bumps already formed thereon onto the first surface of the carrier and electrically connecting the chip to the carrier via the first and second bumps; and
   filling a second underfill between the first underfill and the carrier, wherein the first underfill has a Young's modulus smaller than the second underfill.

9. The process of claim 8, wherein the step of exposing the first bumps includes grinding the first underfill until the first bumps are exposed.

10. The process of claim 8, further comprising applying an encapsulation over the chip and the carrier around the chip after the second underfill has been formed.

* * * * *